United States Patent [19]

Kawaguchi et al.

[11] Patent Number: 5,975,741

[45] Date of Patent: Nov. 2, 1999

[54] WAFER PRODUCING APPARATUS

[75] Inventors: Keishi Kawaguchi; Tatsumi Hamasaki; Yoshihiro Tadera, all of Hiroshima, Japan

[73] Assignee: Toyo Advanced Technologies Co., Ltd., Hiroshima-ken, Japan

[21] Appl. No.: 08/814,849

[22] Filed: Mar. 11, 1997

[30] Foreign Application Priority Data

Mar. 21, 1996 [JP] Japan .................................... 8-064644

[51] Int. Cl.⁶ .................................................. G06F 19/00
[52] U.S. Cl. ............................... 364/468.28; 364/468.22; 364/478.17
[58] Field of Search ....................... 364/468.22, 468.28, 364/478.03, 478.09, 478.16, 478.17, 468.23; 414/935, 937; 198/349.5, 349.6, 363

[56] References Cited

U.S. PATENT DOCUMENTS

| | | | |
|---|---|---|---|
| 3,812,947 | 5/1974 | Nygaard ................................... | 198/617 |
| 4,027,246 | 5/1977 | Caccoma et al. ................... | 364/468.28 |
| 4,120,629 | 10/1978 | Christian et al. ................... | 198/341.02 |
| 5,024,570 | 6/1991 | Kiriseko et al. .......................... | 414/222 |
| 5,375,061 | 12/1994 | Hara et al. .......................... | 364/468.07 |
| 5,399,531 | 3/1995 | Wu ..................................... | 364/468.19 |
| 5,536,128 | 7/1996 | Shimoyashiro et al. ................. | 414/273 |
| 5,537,325 | 7/1996 | Iwakiri et al. ...................... | 364/468.28 |
| 5,551,830 | 9/1996 | Watanabe et al. ....................... | 414/786 |
| 5,745,364 | 4/1998 | Togashi ............................... | 364/468.28 |

*Primary Examiner*—William Grant
*Assistant Examiner*—Sheela S. Rao
*Attorney, Agent, or Firm*—Jordan and Hamburg LLP

[57] ABSTRACT

In the wafer producing apparatus of this invention, wafers each obtained by a slicing operation of a plurality of slicing devices are transported to a common finishing device by a transport device for chamfering. When the wafer is transferred to the transport device, an identification signal for identifying the slicing device by which the wafer is obtained is stored in an identification signal storage device. When the wafer is transferred from the transport device to the finishing device, the identification signal stored in the identification signal storage device is transmitted on a finish control device. Upon completion of the chamfering operation to the wafer by the finishing device, the finish control device controls the finishing device to allow the wafer to be stored in one of a plurality of wafer storage cassettes corresponding to the inputted identification signal. Thereby, even in a case where a working speed of the working device for slicing out a wafer from an ingot differs greatly from a working speed of the finishing device for chamfering the wafer, the wafer producing apparatus can be operated with a high proficiency and wafers processed by the common finishing device can be accurately stored in the proper wafer storage portion.

14 Claims, 6 Drawing Sheets

WAFER PRODUCING APPARATUS

BACKGROUND OF THE INVENTION

This invention relates to a wafer producing apparatus wherein a wafer is sliced out from a working piece such as a semiconductor ingot, subjected to a post-processing such as chamfering, and stored in a predetermined wafer storage portion.

A general type of wafer producing apparatus of the prior art is shown in FIG. 6. In FIG. 6, a workpiece such as a semiconductor ingot set in a slicing device 90 of the wafer producing apparatus, is sliced into pieces one after another to obtain a number of wafers therefrom. Then, the wafer sliced out of the workpiece is cleaned, has a slice base adhered thereto removed and is dried in a wafer processing device 92. The wafer thus processed by the wafer processing device 92 is transported to a chamfering device 94 where the wafer is chamfered, and then to a cleaning/drying device 96 where the wafer, after the chamfering, is cleaned and dried again. The wafer, after the cleaning and drying, is transported to a wafer storage cassette 98. There is prepared a wafer storage cassette for each workpiece. When slicing of one workpiece is finished to obtain a certain number of wafers, and these wafers are all stored in one wafer storage cassette 98, a new workpiece is set in the slicing device 90 and the wafer storage cassette 98 storing the processed wafers therein is replaced with a new empty cassette.

Generally, the number of wafers sliceable by the slicing device 90 per unit time is exceedingly small compared to the number of wafers workable by the chamfering device 94 per the same unit time as of a slicing operation by the slicing device 90. Accordingly, there is generated a long wait time (interval) for the chamfering device 94, from a chamfering operation for one wafer by the chamfering device 94 to a next chamfering operation to be conducted to a next wafer which is transported to the chamfering device 94 from the slicing device 90 and the wafer processing device 92. This would become a hindrance to an effective operation of the chamfering device 94, and greatly obstructs improvement of wafer production efficiency.

SUMMARY OF THE INVENTION

An object of the present invention is to provide a wafer producing apparatus which as solved the above problems residing in the prior art.

Another object of the present invention is to provide a wafer producing apparatus capable of efficiently controlling an operation of finishing means even in the case where there exists a great difference between a speed of working means for slicing out a wafer from a workpiece and a speed of the finishing means for chamfering the wafer, and also capable of accurately storing the wafer chamfered by the finishing means in a proper wafer storage portion corresponding to the working means.

A wafer producing apparatus according to this invention comprises: working means each adapted for slicing out wafers successively from a workpiece; finishing means provided by the number less than the number of working means and for chamfering the sliced out wafer; transport means for transporting the wafer between the working means and the finishing means; work control means for controlling an operation of the working means; and finish control means for controlling an operation of the finishing means. The wafer producing apparatus further comprises an identification signal storage means for reading out, from the work control means, and storing an identification signal for identifying the working means by which the wafer is sliced out from the work in transferring the wafer from the working means to the transport means, and for outputting the identification signal to the finish control means in transferring the wafer from the transport means to the finishing means. The finish control means is arranged such that the wafer after the chamfering operation is allowed to be stored in a wafer storage portion corresponding to the read identification signal indicative of the wafer. Accordingly, even in a case where a working speed of the working means is lower than a working speed of the finishing means, the finishing means can be operated efficiently, thereby improving the productivity of wafers. Further, the wafer after the chamfering operation can be accurately stored in the wafer storage portion corresponding to the working means from which the wafer is sliced out, despite the fact that there is no one-to-one correspondence between the working means and finishing means.

The above and other objects, features and advantages of the present invention will become more apparent upon a reading of the following detailed description and drawings.

DETAILED DESCRIPTION OF THE INVENTION

A preferred embodiment of the present invention is described with reference to FIGS. 1 to 5.

Figure 1:
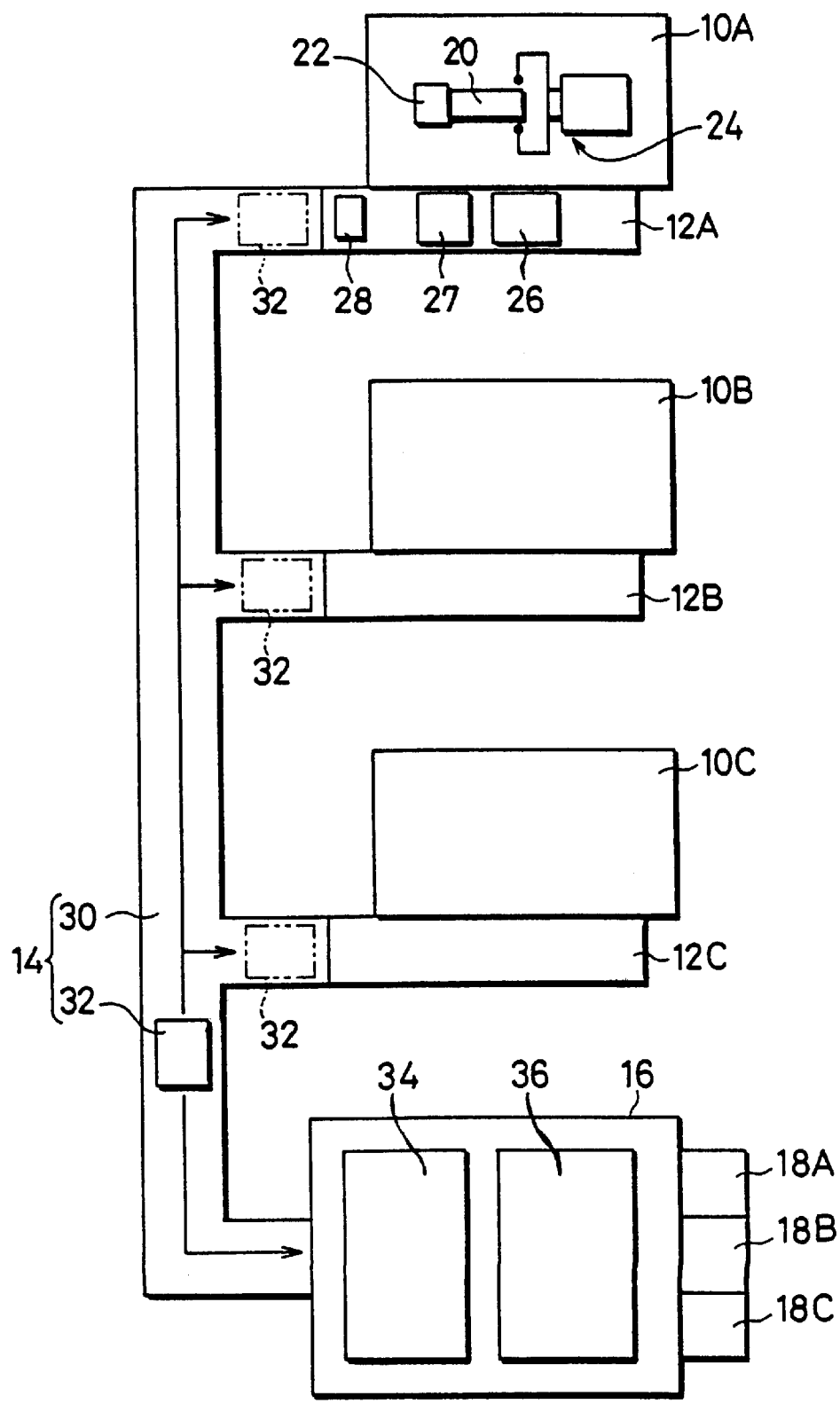
FIG. 1 is a plan view showing an entire arrangement of an embodiment of a wafer producing apparatus according to this invention.

A wafer producing apparatus shown in FIG. 1 comprises: three slicing devices 10A, 10B, 10C; wafer processing sections 12A, 12B, 12C provided next to the corresponding slicing devices 10A, 10B, 10C; a transport device 14; a single finishing section 16; and wafer storage cassettes 18A, 18B, 18C provided in correspondence to the slicing devices 10A, 10B, 10C.

Each of the slicing devices 10A to 10C includes an ingot holding portion 22 for securely holding a semiconductor ingot 20, and an ingot cutting portion 24 for successively slicing out wafers from the ingot 20 which is securely held by the ingot holding portion 22.

The slicing device 10A (10B, 10C) and the corresponding wafer processing section 12A (12B, 12C) constitute working means. Each of the wafer processing sections 12A to 12C further has a wafer cleaning device 26, a slice base removing device 27, and a wafer drying device 28.

The wafer cleaning device 26 is adapted for cleaning a wafer sliced out of the ingot 20, using ultrasonic waves in a bath filled with water. The slice base removing device 27 is adapted for removing a slice base adhered to the wafer after cleaning operation of the wafer cleaning device 26. The slice base is made of carbon and the like. More specifically, the wafer is put into a bath containing hot water to soften an adhesive agent used in adhering the slice base to the wafer, thereby weakening the adhesive force of the adhesive agent and removing the slice base from the wafer. The drying device 28 is adapted to drying the wafer by spraying air onto the wafer which has been picked up from the bath filled with hot water.

The transport device 14 comprises transport rails 30 and a carriage truck 32 which runs along the rails 30. The rails 30 are provided in such a line as to connect the wafer processing sections 12A, 12B, 12C to the finishing section 16. The carriage truck 32 picks up one wafer which has been dried by the drying device 28 upon reaching the designated wafer processing section 12A (or 12B or 12C) (each position shown by the phantom lines in FIG. 1), and transports the wafer to the finishing section 16. This pick up/transport operation of the carriage truck 32 is repeated.

The finishing section 16 comprises a chamfering device 34 and a cleaning/drying device 36. The wafer storage cassettes 18A, 18B, 18C are provided downstream of the cleaning/drying device 36. The chamfering device 34 is adapted for picking up the wafer transported by the carriage truck 32 and chamfering a circumferential end of the wafer. The cleaning/drying device 36 cleans and dries the chamfered wafer. The wafer, after the cleaning/drying operation, is stored in one of the designated cassettes 18A to 18C. A designation of cassette is described later in details.

Figure 2:
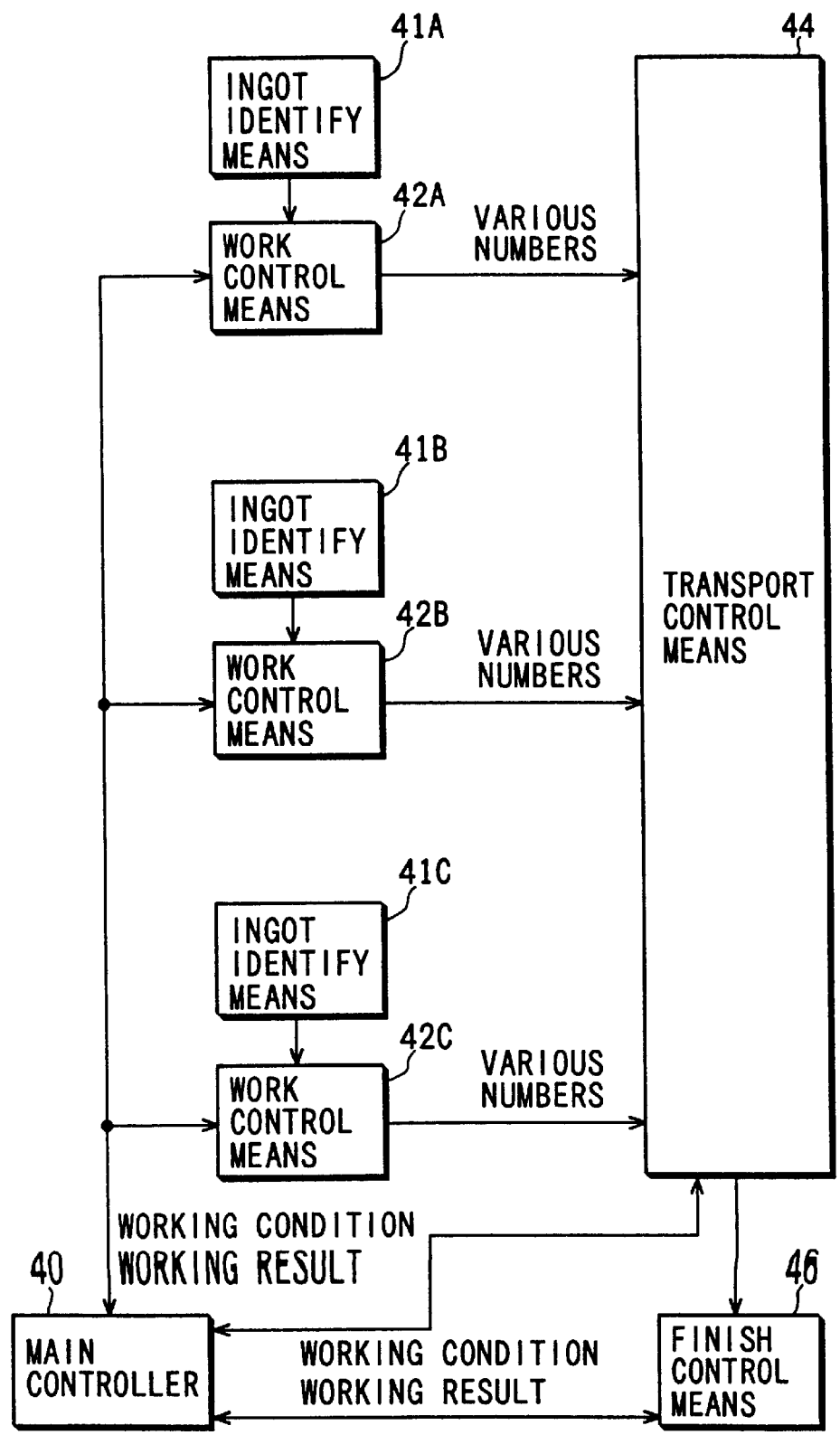
FIG. 2 is a block diagram showing a control system of the wafer producing apparatus.

The wafer producing apparatus of this invention has a control system shown in FIG. 2. The control system comprises a main controller 40, ingot identify means 41A, 41B, 41C, work control means 42A, 42B, 42C, transport control means 44, and finish control means 46.

The main controller (working parameter storage means) 40 is a so-called host computer and stores parameters for cutting ingots (e.g., diameter of ingot and thickness of wafer) and for chamfering wafers (e.g., diameter of ingot), and outputs a reply signal to the work control means 42A to 42C in response to an inquiry on the working parameters therefrom.

The ingot identify means 41A to 41C and work control means 42A to 42C correspond to the slicing devices 10A to 10C and wafer processing devices 12A to 12C, respectively. Each ingot 20 is attached with a bar code representative of an ingot number of identify the ingot. The ingot identify means 41A to 41C read the ingot number from the bar code attached to the ingot 20 which is set in the corresponding slicing device (e.g., the ingot identify means 41A reads the ingot number of the ingot set in the slicing device 10A), and outputs a data signal representative of the read ingot number to the work control means, as an ingot identification signal, (e.g., the ingot identify means 41A outputs a data signal indicative of the read ingot number to the work control means 42A).

The work control means 42A to 42C read out, from the main controller 40, the cutting parameters for cutting the work corresponding to the inputted ingot number and controls the corresponding slicing device and wafer processing section to respectively perform a slicing operation and a specified processing based on the read working condition. The following is a description of the case where control operation is executed with respect to the work control means 42A. Specifically, the work control means 42A reads out the cutting parameter from the main controller 40, and controls the corresponding slicing device (in this case, slicing device 10A) to execute a slicing operation to obtain a wafer W from the ingot 20 set in the slicing device 10A and also controls the corresponding wafer processing device (in this case, wafer processing section 12A) to execute a specified processing. Thereafter, when the wafer W is transferred from the processing section 12A to the carriage truck 32, the work control means 42A sends data, to the transport control means 44, on a slicing device number (identifying which slicing device is used for slicing operation, in this case, slicing device 10A), the ingot number, and wafer number (ordinal number corresponding to the number of slicing operations to be conducted for the same ingot).

The transport control means 44 controls driving of the carriage truck 32 based on a command signal outputted from the main controller 40. In transferring a wafer W to the carriage truck 32, the transport control means 44 stores the data concerning various numbers identifying the wafer W (slicing device number, ingot number, and wafer number) as a wafer identification signal, and outputs the stored data to the finish control means 46 when the wafer W is transferred from the carriage truck 32 to the finishing section 16.

Then, the finish control means 46 reads out, from the main controller 40, the working parameters concerning chamfering of the work corresponding to the inputted ingot number, controls the chamfering device 34 and cleaning/drying device 36 to conduct chamfering and cleaning/drying operations to the wafer W based on the working parameters. Thereafter, the finish control means 46 controls the processed wafer W to be stored in the wafer storage cassette (in this case, wafer storage cassette 18A) corresponding to the inputted device number (in this case, slicing device 10A).

Next, specific control operations to be conducted by each control means are described with reference to flowcharts in FIGS. 3 to 6.

Figure 3:
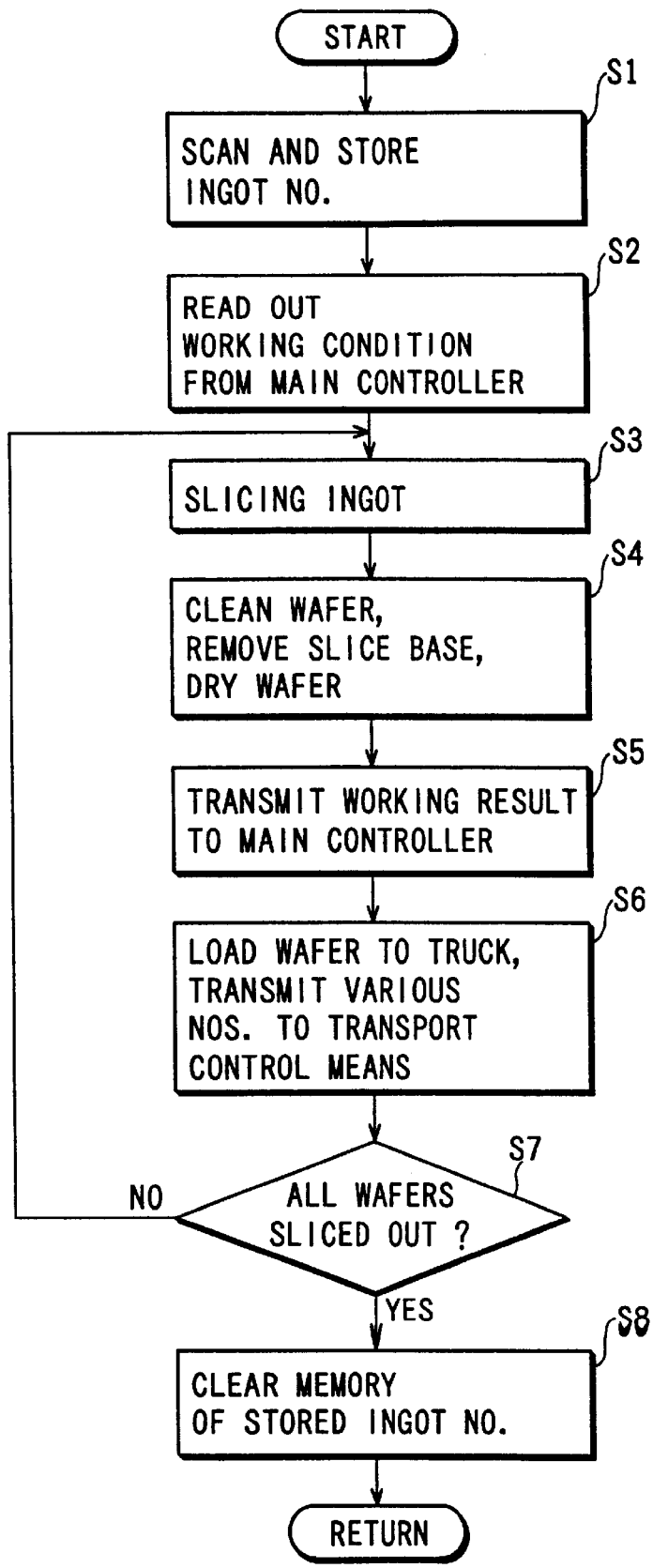
FIG. 3 is a flowchart showing control operations executed by work control means provided in the wafer producing apparatus.
Figure 4:
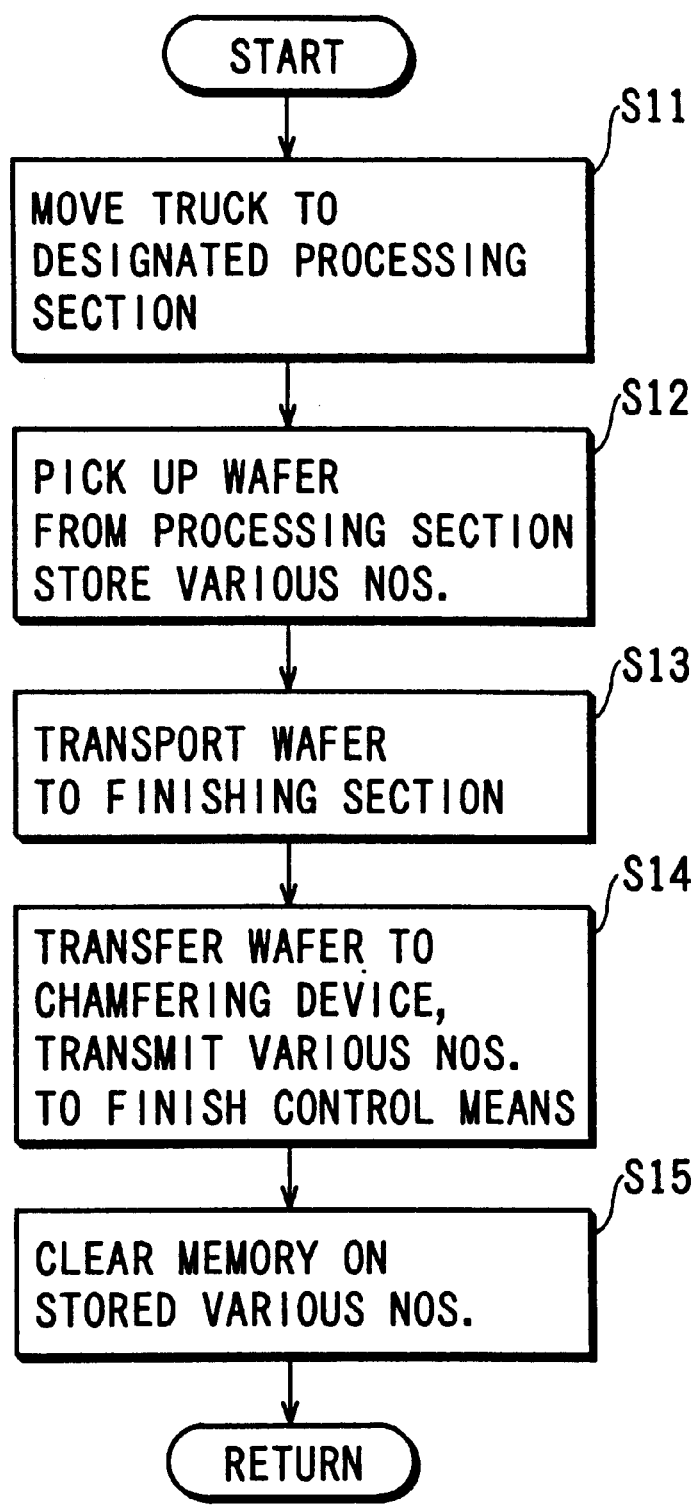
FIG. 4 is a flowchart showing control operations executed by transport control means provided in the wafer producing apparatus.
Figure 5:
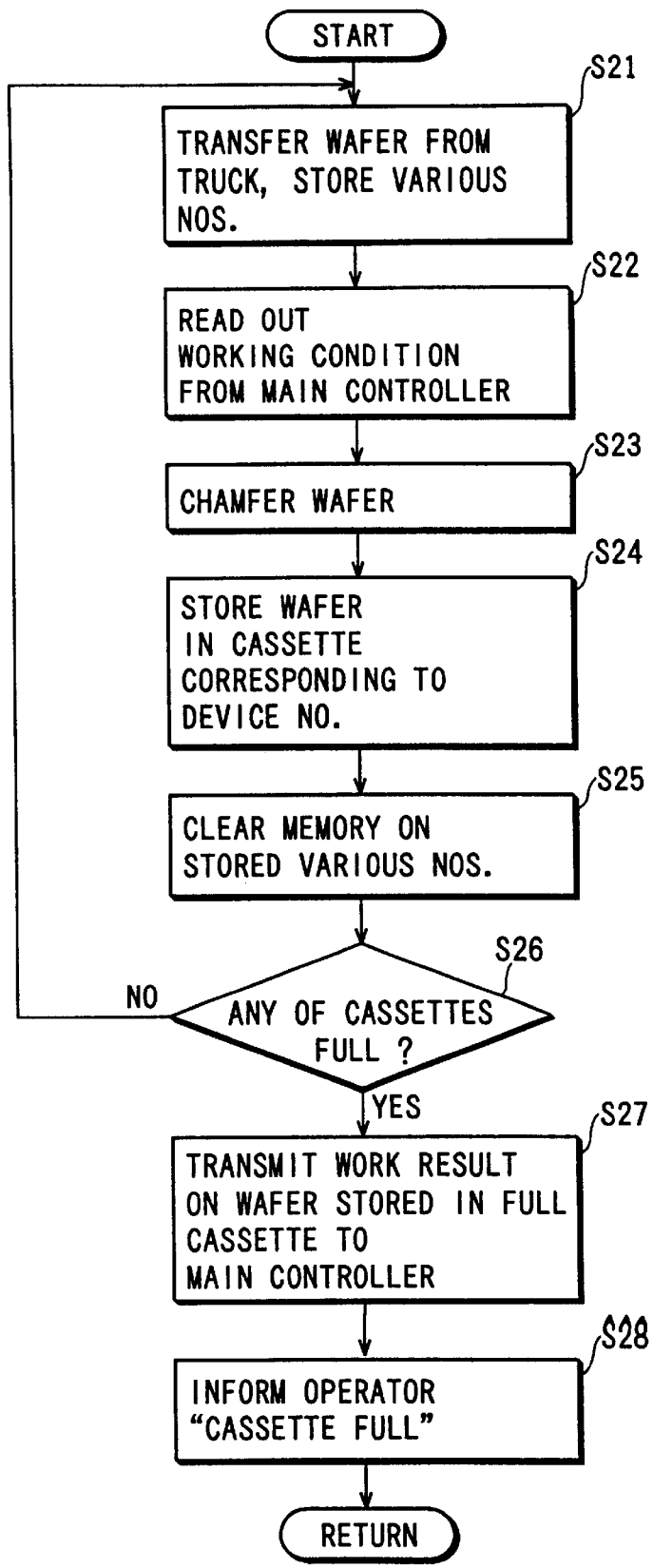
FIG. 5 is a flowchart showing control operations executed by finish control means provided in the wafer producing apparatus.
Figure 6:
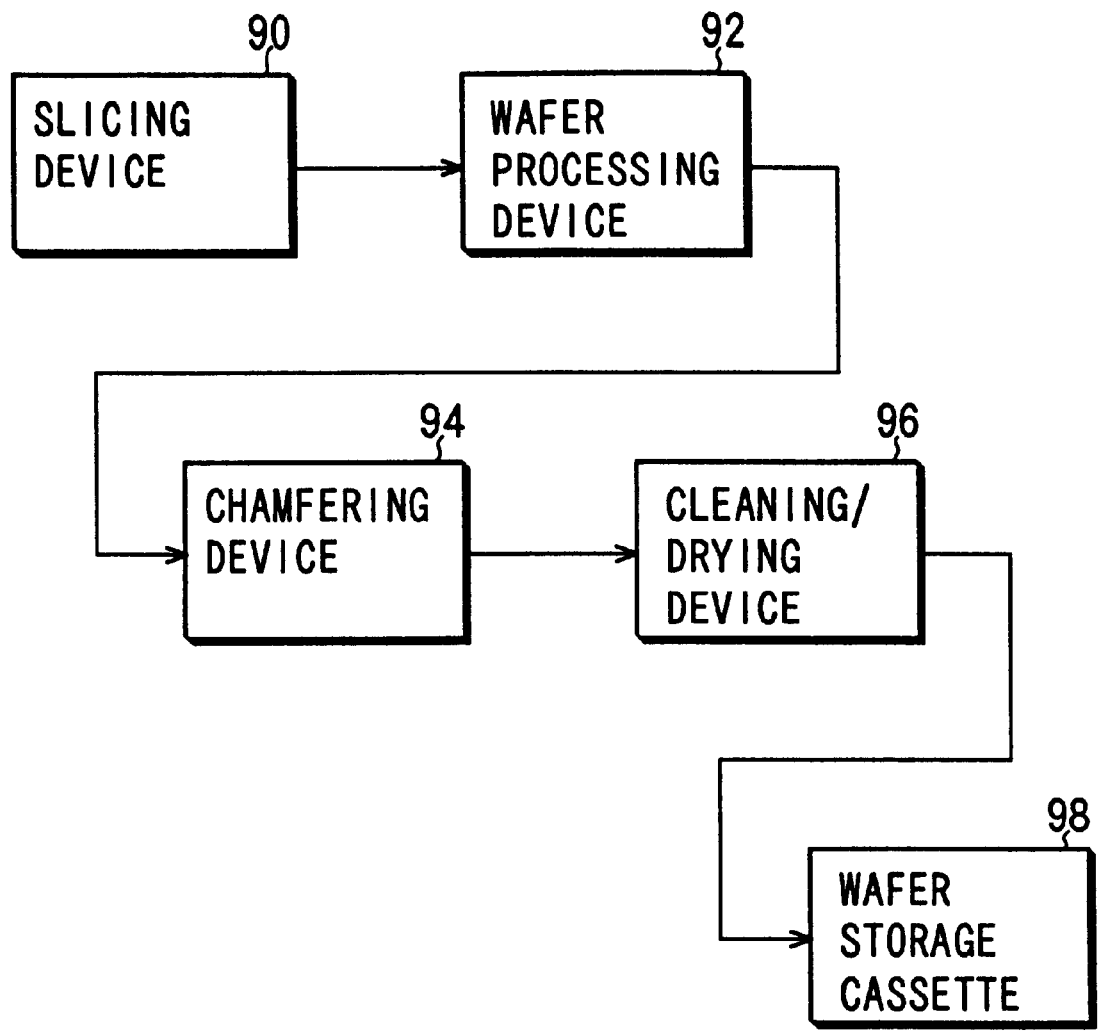
FIG. 6 is a block diagram showing an entire arrangement of a wafer producing apparatus of the prior art.

1) Control operations of ingot read (identify) means 41A to 41C and work control means 42A to 42C (FIG. 3);

Step S1: Ingot identify means 41A (or 41B, 41C) reads the ingot number through the bar code attached to the ingot 20 which is set in the slicing device 10A (or 10B or 10C) and the work control means 42A (or 42B or 42C) stores the read ingot number therein;

Step S2: The work control means outputs an inquiry signal inquiring as to the working parameters for the ingot 20 corresponding to the read ingot number to the main controller 40. The main controller 40, in turn, searches for the working parameters corresponding to the ingot number, and outputs a data signal concerning the working parameters, to the work control means which has outputted the inquiry signal.

Step S3: The work control means controls the corresponding slicing device to execute a slicing of the ingot 20 to obtain a wafer W based on the data signal sent from the main controller 40.

Step S4: The work control means controls the corresponding wafer processing section to clean the wafer W, remove a slice base from the wafer W, and dry the wafer W.

Step S5: After processing of the wafer W in Step S4, the work control means transmits a working result on the wafer W to the main controller 40. Thereby, the main controller 40 is informed of which wafer processing section the carriage truck 32 is to be directed to.

Step S6: The processed wafer W is loaded in the carriage truck 32 which has been dispatched to the wafer processing section based on a command signal from the main controller 40 and a control signal from the transport control means 44, while the work control means is transmitting data on the ingot number which is stored currently therein, together with the wafer number indicative of the wafer W loaded in the carriage truck 32 and slicing device number, to the transport control means 44.

Steps S7, S8: Operations from Steps S1 to S6 are repeated until slicing operation for the ingot 20 is completed (NO in Step S7). Upon completion of slicing of all wafers from the ingot 20, i.e., the ingot 20 set in the slicing device is gone (YES in Step S7), the ingot number stored in the work control means is cleared (in Step S8).

2) Control operations of the transport control means 44 (FIG. 4):

Step S11: The transport control means 44 controls the carriage truck 32 to be moved to the designated wafer processing section 12A (or 12B or 12C) upon receiving a command signal from the main controller 40, i.e., to the wafer processing section where a processing operation to a wafer W in the wafer processing section has been finished.

Step S12: The transport control means 44 controls pickup means, such as an arm member (not shown) which is equipped in the carriage truck 32, to pick up the processed wafer W and load the wafer W in the carriage truck 32. Thereupon, the transport control means 44 stores various numbers (ingot number, wafer number, and slicing device number) as a wafer identification signal indicative of the loaded wafer W therein. The wafer identification signal is inputted from the corresponding work control means (e.g., in case that the wafer W is transferred from the wafer processing section 12A, the work control means 42A outputs the wafer identification signal).

Step S13: The transport control means 44 controls the carriage truck 32 to transport the loaded wafer W to the finishing section 16.

Step S14: The transport controls means 44 controls the carriage truck 32 to transfer the wafer W to the chamfering device 34 of the finishing section 16, while transmitting the stored data concerning the various numbers to the finish control means 36. Specifically, the transport control means 44 serves as a messenger means for conveying a data signal (wafer identification signal) concerning the various numbers from the work control means (42A to 42C) to the finish control means 36.

Step S15: The transport control means 44 clears the memory on the various numbers and thus is ready for storing data concerning various numbers of a next wafer to be transported to the finishing section 16. Thus, each time of transporting a wafer, old data is overwritten by new data, thereby assuredly conveying correct data concerning the wafer being transported to the finish control means 36.

Control operations of the finish control means 46 (FIG. 5):

Step S21: The wafer W transported by the carriage truck 32 is transferred to the finishing section 16. At the same time, the finish control means 46 stores the various numbers of the wafer W which is transmitted from the transport control means 44.

Step S22: The finish control means 46 sends an inquiry signal to the main controller 40, inquiring as to the working condition (chamfering parameters) under which the wafer W corresponding to the inputted ingot number is to be processed. The main controller 40, in response to the inquiry signal, searches for the working condition and outputs a data signal indicative of the searched working condition to the finish control means 46.

Step S23: The finish control means 46 controls the chamfering device 34 to execute a chamfering operation to the wafer W based on the inputted working (chamfering) parameter and also controls the cleaning/drying device 36 to clean and dry the chamfered wafer W.

Step S24: Designated is the wafer storage cassette, corresponding to the inputted device number, of the three cassettes 18A to 18C and storage of the wafer W in the designated cassette is affected. For example, when the inputted device number indicates the slicing device 10A and wafer processing section 12A, the wafer W is stored in the wafer storage cassette 18A.

Step S25: After storage of the wafer W, the finish control means 44 clears the memory on the stored various numbers concerning the wafer W.

Steps S26 to S28: At a timing when any of the wafer storage cassettes is full of processed wafers, i.e., when slicing operation of one ingot set in the slicing device corresponding to the full cassette is completed (YES in Step S26), the finish control means 46 sends a working result on all the wafers stored in the full cassette to the main controller 40 (in Step S27). Then, the main controller 40 sends an alarm to an operator to the effect that the cassette is full and a cassette replacement is necessary (in Step S28). For example, in the case where the cassette 18A is full, the operator is informed that the cassette 18A is full. Thereby, the full cassette 18A is replaced with a new empty cassette. It is to be noted the fact that the cassette 18A is full means that the ingot set in the slicing device 10A is gone. Accordingly, a new ingot is set in the slicing device 10A, together with the cassette replacement.

With the thus arranged wafer producing apparatus, wafers sliced out from the workpieces set in the three slicing devices 10A to 10C are all carried to the common finishing section 16. This arrangement drastically increases the production efficiency of wafers, because all the devices can be operated efficiently even if the slicing speed of the slicing devices 10A to 10C is exceedingly low compared to the chamfering speed of the finishing section 16.

In transferring a wafer to the carriage truck 32 from the wafer processing section 12A (or 12B or 12C), various numbers on the wafer are transmitted to the transport control means 44 from the work control means corresponding to the wafer processing section. Also, in transferring the wafer from the carriage truck 32 to the finishing section 16, the above various numbers on the wafer are transmitted to the finish control means 46 from the transport control means 44. Accordingly, the processed wafer is assuredly stored in the cassette corresponding to the slicing device from which the wafer is sliced out. To sum up, despite the fact that all the wafers sliced out from the slicing devices 10A to 10C are transported to the single finishing section 16, the wafers which has been sliced out from an ingot set in the slicing device 10A (or 10B or 10C) is assuredly stored in the corresponding cassette 18A (or 18B or 18C).

In particular, according to the wafer producing device of this invention, the ingot number for identifying the ingot from which the wafers are obtained is transmitted from the corresponding work control means to the finish control means 46 as one of the various numbers, as well as the device number for identifying the slicing device used in slicing out the wafers. Accordingly, the finishing section 16 performs the chamfering operation suitable to the wafer (a piece of work) transported thereto.

The present invention is not limited to the above embodiment, and may be applicable to the following modifications.

(1) "Working means" in this invention may at least have a function of slicing out a wafer from a workpiece. In other words, the wafer processing section 12 shown in FIG. 1 may be omitted, and appropriate processing means may be equipped on the side of the finishing section 16. Alternatively, means for slicing out a wafer from a work may not be constrained to any specific form. For instance, a wire saw may be employed as the slicing devices 10A to 10C.

(2) According to this invention, the numeric ratio of working means and finishing means may be desirably set (in inverse proportion to) in accordance with the ratio of working speeds of these two means. For instance, in the wafer producing apparatus shown in FIG. 1, if the ratio of working speed of the slicing devices 10A to 10C to that of the chamfering device 34 is 1:2, the wafer producing apparatus may be quipped with two slicing devices 10A, 10B and one finishing section 16. Alternatively, two or more finishing means may be provided, as far as the requirement that the number of finishing means is less than the number of working means is satisfied. For example, there may be provided three working means and two finishing means and wafers sliced out from these three working means may be equivalently distributed to the two finishing means.

(3) In the foregoing embodiment, the transport control means 44 also functions as wafer identification signal storage means. Alternatively, this storage means may be provided independently of the transport control means 44. It should be noted, however, that a timing at which a wafer identification signal is inputted to the wafer identification signal storage means, and a timing at which the wafer identification signal is transmitted to the finish control means from the wafer identification signal storage means respectively correspond to a timing at which a wafer is transferred from the working means to the transport means and a timing at which the wafer is transferred from the transport means to the finishing means. Accordingly, the above embodiment in which the transport control means 44 also functions as the wafer identification signal storage means is advantageous in securely transmitting the wafer identification signal from the work control means to the finish control means, as well as attaining simplification of the arrangement of the wafer producing apparatus and production of the apparatus at a lower cost.

It is to be noted, however, that a timing of transferring a wafer from the working means to the transport means is not necessarily required to coincide with a timing of inputting a wafer identification signal to the wafer identification signal storage means. That is, there may be allowed a time lag of a certain extent between these timings as far as there can be maintained a correspondence between transport of the wafer and input of the wafer identification signal identifying the wafer.

(4) In the above embodiment, the carriage truck 32 carries one wafer in each driving thereof. Alternatively, a certain number of processed wafers are temporarily stored in a container or its equivalent in the corresponding wafer processing section 12A (or 12B or 12C), and these wafers may be transferred to the carriage truck 32 simultaneously in a group for transport to the finishing section 16. In this case, however, it is essential for the carriage truck 32 to load wafers which have been sliced out from the same slicing device and processed by the wafer processing section corresponding to the slicing device in a group. This is because loading wafers which have been sliced out by a plurality of slicing devices and processed by a plurality of wafer processing sections in the carriage truck 32 at the same time altogether may lead to a difficulty in identifying the slicing device and wafer processing section by which each wafer is obtained and processed.

(5) Further, a specific arrangement order of working means and finishing means is not constrained to the above. For example, the working means may be arranged around the finishing means in a circle and a connection line between each working means the finishing means may extend radially outward from the finishing means as the center point.

(6) In the above embodiment, the wafer producing apparatus has a single main controller 40 as working condition storage means. Alternatively, a superior host computer for use in a plant may store the above working conditions, as well as other working conditions to be used for working the wafers in other steps. In this case, the main controller 40 of the wafer producing apparatus is used as a so-called cell computer, and inquires the working condition to the plant host computer, stores a reply result on the inquiry from the host computer therein, and replies to an inquiry on the working condition from any of the work control means based on the stored reply result.

As mentioned above, the present invention is directed to a wafer producing apparatus comprising: a plurality of working means each adapted for slicing out wafers successively from a workpiece; a finishing means provided in a number less than the number of working means and for chamfering the sliced out wafer; transport means for transporting the wafer obtained from any of the plurality of working means to the finishing means; a plurality of wafer storage portions corresponding to the plurality of working means; work control means provided in each working means and adapted for controlling an operation of the corresponding working means and outputting an identification signal for identifying the working means by which the wafer is processed in transferring the wafer from the working means to the transport means; identification signal storage means for reading and storing the identification signal outputted from the work control means therein and outputting the identification signal when the wafer corresponding to the identification signal is transferred from the transport means to the finishing means; transport control means for controlling an operation of the transport means; and finish control means for reading the identification signal outputted from the identification signal storage means when the wafer is transferred from the transport means to the finishing means, controlling the finishing means to chamfer the wafer, and allowing the wafer after completion of the chamfering to be stored in the wafer storage portion corresponding to the read identification signal.

With this arrangement, the wafers sliced out by the plurality of working means are transported by the transport means to the finishing means whose number is less than the working means for chamfering operation. Accordingly, even in a case that the working speed of the working means is lower than the working speed of the finishing means, the finishing means is operated efficiently. In addition, in transferring the wafer from the working means to the transport means, inputted is the identification signal for identifying the working means used for slicing out the wafer from the work control means to the identification signal storage means. The identification signal storage means stores the inputted identification signal therein, and then outputs the same to the finish control means when the wafer is transferred from the transport means to the finishing means. The finish control means is arranged such that the wafer chamfered by the finishing means may be stored in the wafer storage portion corresponding to the identification signal.

Accordingly, each wafer, after chamfering operation, is assuredly stored in the wafer storage portion corresponding to the working means by which the wafer is obtained. In other words, despite the fact that there is no one-to-one correspondence between the working means and the finishing means, the wafers sliced out from the same workpiece by the same working means are assuredly stored in the common wafer storage portion corresponding to the working means.

The identification signal storage means may be provided dedicatedly. However, considering the fact that a timing at which the identification signal is inputted to the identification signal storage means corresponds to a timing at which the wafer identified by the identification signal is transferred from the working means to the transport means, while a timing at which the identification signal is inputted from the identification signal storage means to the finish control means corresponds to a timing at which the wafer is transferred from the transport means to the finishing means, it is noticeably reasonable to utilize the transport control means which controls the timing of transferring the wafer as the identification signal storage means. More specifically, by allowing the transport control means to function as the identification signal storage means, the arrangement of the wafer producing apparatus is simplified, and the apparatus is produced at a lower cost, while assuredly transmitting the identification signal at a proper timing.

The identification signal may at least identify the working means by which the wafer is obtained. However, if a work identification signal for identifying the work from which the wafer is sliced out is employed as an identification signal, the working condition for the work can also be accurately transmitted to the finish control means. For example, the wafer producing apparatus according to this invention may comprise: working condition storage means for storing a working condition for each workpiece therein; and work identify means for identifying the work to be introduced to each of the working means. Further, the work control means may read out the working condition corresponding to the workpiece identified by the work identify means from the working condition storage means, control the corresponding working means to execute a processing operation to the workpiece based on the read working condition, and allow a workpiece identification signal for identifying the workpiece to be outputted to the identification signal storage means and to be stored therein. The identification signal storage means may allow the work identification signal to be outputted to the finish control means when the workpiece is transferred from the transport means to the finishing means, and the finish control means may read out, from the working condition storage means, the working condition for the workpiece corresponding to the workpiece identification signal outputted from the identification signal storage means and control the finishing means to execute a chamfering operation on the workpiece based on the read working condition. With this arrangement, the workpiece control means and the finish control means accurately reads out, from the working condition storage means, the working condition suitable for the workpiece for which working is to be conducted currently, and proper control is performed for the workpiece based on the read working condition. Further, the working condition for the workpiece at issue is more reliably transmitted to the finish control means. More specifically, despite the fact that there is no one-to-one correspondence between the working means and the finishing means, the working condition suitable for the wafer to be transported to the finishing means is accurately transmitted to the finish control means. Thereby, a proper chamfering operation for each wafer assuredly performed based on the obtained working condition.

Although the present invention has been fully described by way of example with reference to the accompanying drawings, it is to be understood that various changes and modifications will be apparent to those skilled in the art. Therefore, unless otherwise such change and modifications depart from the scope of the invention, they should be construed as being included therein.

What is claimed is:

1. A wafer producing apparatus for processing a workpiece, comprising:

at least two working means for slicing wafers successively from the workpiece;

a number of finishing means for chamfering the wafers, the number of the finishing means being less than a number of working means of said at least two working means;

transport means for transporting the wafers processed by each of the at least two working means to the number of finishing means;

at least two wafer storage means for storing the wafers after processing by the number of finishing means, each of the at least two wafers storage means respectively corresponding to one of the at least two working means;

work control means, each associated with one of the at least two working means, for controlling operation of the associated one of the at least two working means including transport of the wafers from the associated one of the at least two working means to the transport means, and outputting an identification signal to identify the associated one of the at least two working means from which the wafers are transported to the transport means;

transport control means for controlling the transport means to transfer the wafers to the number of finishing means;

identification signal storage means for reading and storing the identification signal and for outputting the identification signal to identify the associated one of the at least two working means from which the wafers are transported; and finish control means for reading the identification signal outputted from the identification signal storage means for the wafers transferred from the transport means to the number of finishing means, for controlling the number of finishing means to chamfer the wafers based on the identification signal for the wafers, and for storing the wafers after completion of the chamfering in one of the at least two wafers storage means corresponding to the associated one of the at least two working means identified by the identification signal.

2. A wafer producing apparatus according to claim 1, wherein the transport control means includes the identification signal storage means.

3. A wafer producing apparatus according to claim 2, further comprising:

working parameter storage means for storing a working parameter for each workpiece;

workpiece identification means for identifying the workpiece sliced by each of the at least two working means;

the work control means including means for:

reading the working parameter corresponding to the workpiece, identified by the workpiece identification means, from the working parameter storage means to control the associated one of the at least two working means to execute a processing operation for slicing the workpiece based on the working parameter corresponding to the workpiece, and inputting a workpiece identification signal for identifying the workpiece to the identification signal storage means;

the identification signal storage means including means for inputting the workpiece identification signal to the finish control means for the workpiece of which the wafers are transferred from the transport means to the number of finishing means; and the finish control means including means for reading from the working parameter storage means the working parameter for the workpiece corresponding to the workpiece identification signal outputted from the identification signal storage means to control the number of finishing means to execute chamfering of the wafers of the workpiece identified based on the working parameter read.

4. The wafer producing apparatus of claim 3 wherein the wafers are transported one at a time by the transport means.

5. The wafer producing apparatus of claim 2 wherein the wafers are transported one at a time by the transport means.

6. A wafer producing apparatus according to claim 1, further comprising:

working parameter storage means for storing a working parameter for each workpiece;

workpiece identification means for identifying the workpiece sliced by each of the at least two working means;

the working control means including means for:
reading the working parameter corresponding to the workpiece, identified by the workpiece identification means, from the working parameter storage means to control the associated one of the at least two working means to execute a processing operation for slicing the workpiece based on the working parameter corresponding to the workpiece, and inputting a workpiece identification signal for identifying the workpiece to the identification signal storage means;

the identification signal storage means including means for inputting the workpiece identification signal to the finish control means for the workpiece of which the wafers are transferred from the transport means to the number of finishing means; and the finish control means including means for reading from the working parameter storage means the working parameter for the workpiece corresponding to the workpiece identification signal outputted from the identification signal storage means to control the number of finishing means to execute chamfering of the wafers of the workpiece identified based on the working parameter read.

7. The wafer producing apparatus of claim 6 wherein the wafers are transported one at a time by the transport means.

8. The wafer producing apparatus of claim 1 wherein the wafers are transported one at a time by the transport means.

9. The wafer producing apparatus of claim 1 wherein:
a throughput rate of one of the working means is less than a throughput rate of one of the finishing means; and
a ratio of the number of the working means to the number of the finishing means is equal to or less than a ratio of the throughput rate of one of the finishing means to the throughput rate of one of the working means.

10. The wafer producing apparatus of claim 1 wherein:
a throughput rate of one of the working means is less than a throughput rate of one of the finishing means; and
a ratio of the number of the working means to the number of the finishing means is equal to or less than a ratio of the throughput rate of one of the finishing means to the throughput rate of one of the working means.

11. A wafer producing apparatus for processing a workpiece, comprising:

at least two working means for slicing wafers successively from the workpiece;

a number of finishing means for chamfering the wafers, the number of the finishing means being less than a number of working means of said at least two working means;

transport means movable back and forth between any of the at least two working means and any of the number of finishing means for transporting the wafers processed by each of the at least two working means to the number of finishing means;

at least two wafer storage means for storing the wafers after processing by the number of finishing means, each of the at least two wafers storage means respectively corresponding to one of the at least two working means;

work control means, each associated with one of the at least two working means, for controlling operation of the associated one of the at least two working means including transport of the wafers from the associated one of the at least two working means to the transport means, and outputting an identification signal to identify the associated one of the at least two working means from which the wafers are transported to the transport means;

transport control means for controlling the transport means to transfer the wafers to the number of finishing means;

identification signal storage means for reading and storing the identification signal and for outputting the identification signal to identify the associated one of the at least two working means from which the wafers are transported; and finish control means for reading the identification signal outputted from the identification signal storage means for the wafers transferred from the transport means to the number of finishing means, for controlling the number of finishing means to chamfer the wafers based on the identification signal for the wafers, and for storing the wafers after completion of the chamfering in one of the at least two wafers storage means corresponding to the associated one of the at least two working means identified by the identification signal.

12. A wafer producing apparatus for processing a workpiece, comprising:

at least two working means for slicing wafers successively from the workpiece, each of the at least two working means being independently operated in accordance with a working parameter applied thereto for setting individual working conditions;

a number of finishing means for chamfering the wafers, the number of the finishing means being less than a number of working means of said at least two working means;

transport means for transporting the wafers processed by each of the at least two working means to the number of finishing means;

at least two wafer storage means for storing the wafers after processing by the number of finishing means, each of the at least two wafers storage means respectively corresponding to one of the at least two working means;

work control means, each associated with one of the at least two working means, for controlling operation of the associated one of the at least two working means including transport of the wafers from the associated one of the at least two working means to the transport means, and outputting an identification signal to identify the associated one of the at least two working means from which the wafers are transported to the transport means;

transport control means for controlling the transport means to transfer the wafers to the number of finishing means;

identification signal storage means for reading and storing the identification signal and for outputting the identification signal to identify the associated one of the at least two working means from which the wafers are transported; and finish control means for reading the identification signal outputted from the identification signal storage means for the wafers transferred from the transport means to the number of finishing means, for controlling the number of finishing means to chamfer the wafers based on the identification signal for the wafers, and for storing the wafers after completion of the chamfering in one of the at least two wafers storage means corresponding to the associated one of the at least two working means identified by the identification signal.

13. A wafer producing apparatus according to claim 12, further comprising:

working parameter storage means for storing the working parameter for each workpiece;

workpiece identification means for identifying the workpiece sliced by each of the at least two working means; and the work control means including means for reading the working parameter corresponding to the workpiece, identified by the workpiece identification means, from the working parameter storage means to control the associated one of the at least two working means to execute a processing operation for slicing the workpiece based on the working parameter corresponding to the workpiece.

14. A wafer producing apparatus according to claim 13, further comprising:

the work control means including means for inputting a workpiece identification signal for identifying the workpiece to the identification signal storage means;

the identification signal storage means including means for inputting the workpiece identification signal to the finish control means for the workpiece of which the wafers are transferred from the transport means to the number of finishing means; and the finish control means including means for reading from the working parameter storage means the working parameter for the workpiece corresponding to the workpiece identification signal outputted from the identification signal storage means to control the number of finishing means to execute chamfering of the wafers of the workpiece identified based on the working parameter read.

* * * * *